United States Patent
Motwani

(10) Patent No.: US 8,549,380 B2
(45) Date of Patent: Oct. 1, 2013

(54) NON-VOLATILE MEMORY ERROR MITIGATION

(75) Inventor: Ravi H Motwani, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 275 days.

(21) Appl. No.: 13/175,459

(22) Filed: Jul. 1, 2011

(65) Prior Publication Data

US 2013/0007559 A1 Jan. 3, 2013

(51) Int. Cl.
*G11C 29/00* (2006.01)
*H03M 13/00* (2006.01)
*H03M 13/03* (2006.01)

(52) U.S. Cl.
USPC ........... 714/763; 714/718; 714/751; 714/769; 714/794; 365/185.02; 365/185.09

(58) Field of Classification Search
USPC .... 714/763, 718, 751, 769, 794; 365/185.02, 365/185.09
See application file for complete search history.

(56) References Cited

U.S. PATENT DOCUMENTS

| | | | | |
|---|---|---|---|---|
| 7,656,707 B2* | 2/2010 | Kozlov | | 365/185.05 |
| 7,876,784 B1* | 1/2011 | Lee | | 370/473 |
| 7,975,209 B2* | 7/2011 | Chin et al. | | 714/780 |
| 8,059,763 B1* | 11/2011 | Varnica et al. | | 375/341 |
| 8,239,734 B1* | 8/2012 | Shalvi | | 714/770 |
| 8,301,979 B2* | 10/2012 | Sharon et al. | | 714/763 |
| 2009/0199074 A1* | 8/2009 | Sommer | | 714/763 |
| 2010/0034018 A1* | 2/2010 | Yang et al. | | 365/185.2 |
| 2010/0034323 A1* | 2/2010 | Stoye | | 375/341 |
| 2011/0216586 A1* | 9/2011 | Graef et al. | | 365/185.02 |
| 2013/0007571 A1* | 1/2013 | Li et al. | | 714/795 |

OTHER PUBLICATIONS

Motwani et al., Robust Decoder Architecture for Multi-level Flash Memory Storage Channels, 2012, IEEE, pp. 492-496.*

* cited by examiner

*Primary Examiner* — John J Tabone, Jr.
(74) *Attorney, Agent, or Firm* — Blakely, Sokoloff, Taylor & Zafman LLP

(57) ABSTRACT

Techniques for decoding levels in non-volatile memory. A level of a cell in a multi-bit non-volatile memory is read. A minimum of Log-Likelihood Ratio (LLR) and a modified LLR to decode the level, wherein the modified LLR is a function of a misplacement probability is used. A value corresponding the decoded level is written to a volatile memory.

18 Claims, 7 Drawing Sheets

US 8,549,380 B2

NON-VOLATILE MEMORY ERROR MITIGATION

TECHNICAL FIELD

Embodiments of the invention relate to techniques for mitigation of errors in non-volatile memory devices (e.g., flash memory). More particularly, embodiments of the invention relate to techniques for modification of encoding and/or decoding techniques to mitigate non-volatile memory device errors.

BACKGROUND

NAND flash memories that have two or three bits per cell may suffer from program disturb (PD) and single bit cell leakage (SBCL). In a three-bit-per-cell NAND flash memory, PD may cause a level 0 written to a NAND flash cell to gain charge if neighboring cells are charged to a higher level, for example, level 7, which may cause the bit to be read out as a level 1 (or even a higher level). SBCL happens when charge leaks from a higher level, for example, a level 7 to result in the bit being read out as a lower level. Both PD and SBCL can cause a bit 1 to be readout as bit 1 for the upper page. This impairment is referred to as long tails due to PD and SBCL.

For NAND flash memories with Low-Density Parity Check (LDPC) encoded data, when data is read out of the upper page, a 0 may not be as reliable as for single-bit cells because the 0 may be the result of misplacement. Misplacement occurs when the lower page read-out is in error while programming a middle page, or a middle page read has errors while programming the upper page, for a three bit per cell NAND flash memory. Misplacements cause NAND flash memories to not be as reliable as necessary for some applications.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 1:
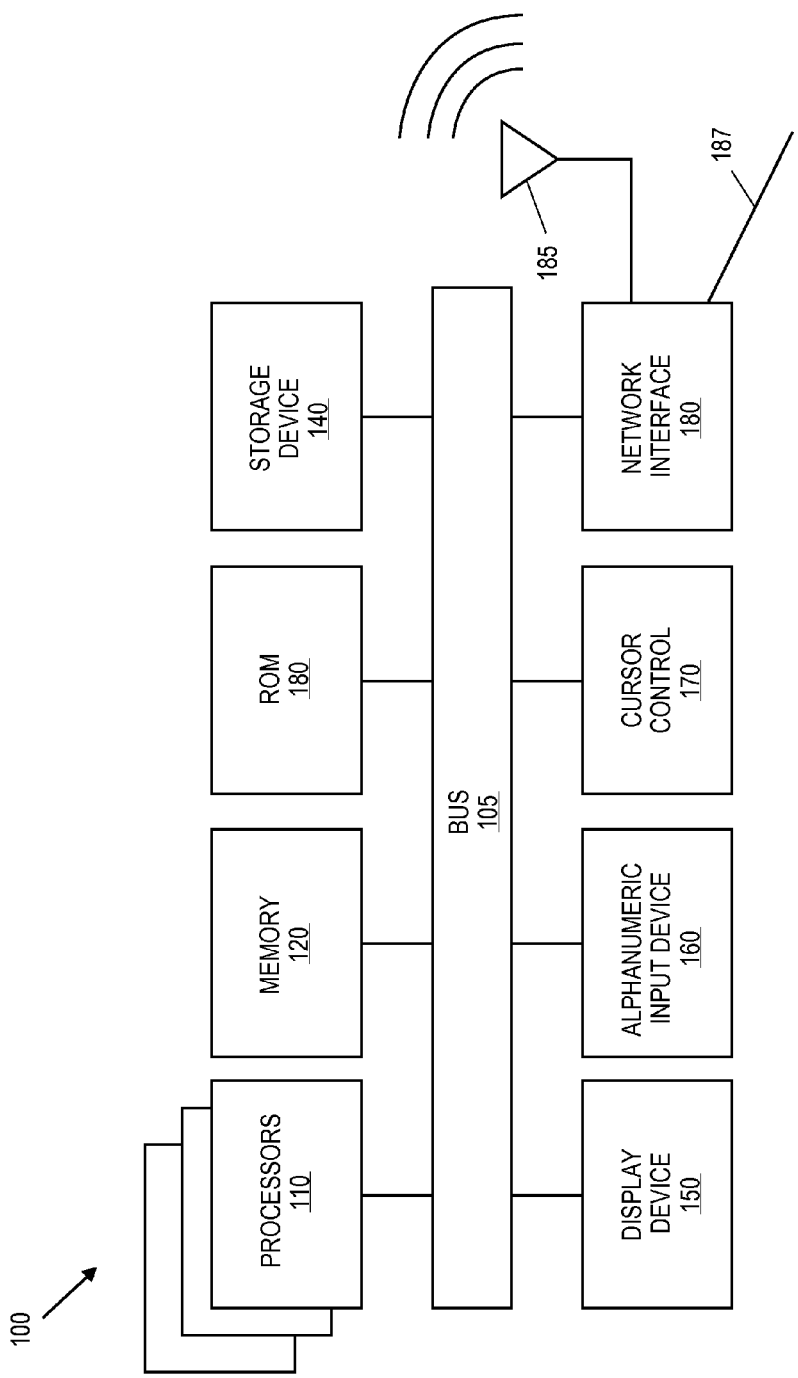
FIG. 1 is a block diagram of one embodiment of an electronic system.

FIG. 1 is a block diagram of one embodiment of an electronic system. The electronic system illustrated in FIG. 1 is intended to represent a range of electronic systems (either wired or wireless) including, for example, desktop computer systems, laptop computer systems, tablet devices, cellular telephones, personal digital assistants (PDAs) including cellular-enabled PDAs, set top boxes. Alternative electronic systems may include more, fewer and/or different components.

Electronic system 100 includes bus 105 or other communication device to communicate information, and processor 110 coupled to bus 105 that may process information. While electronic system 100 is illustrated with a single processor, electronic system 100 may include multiple processors and/or co-processors. Electronic system 100 further may include random access memory (RAM) or other storage device 120 (referred to as memory), coupled to bus 105 and may store information and instructions that may be executed by processor 110. Memory 120 may also be used to store temporary variables or other intermediate information during execution of instructions by processor 110.

In one embodiment, memory 120 includes non-volatile memory. The non-volatile memory may be any type of non-volatile memory, for example, flash memory or phase change memory. In one embodiment, NAND flash memory is utilized. The flash memory may be single bit per cell memory, or multi-bit per cell memory. In the examples that follow, two-bit per cell NAND flash memory and three-bit per cell NAND flash memory; however, the techniques described herein are applicable to other non-volatile memories.

Electronic system 100 may also include read only memory (ROM) and/or other static storage device 130 coupled to bus 105 that may store static information and instructions for processor 110. Data storage device 140 may be coupled to bus 105 to store information and instructions. Data storage device 140 such as a magnetic disk or optical disc and corresponding drive may be coupled to electronic system 100. Data storage device 140 may also be a Solid State Drive (SSD), one embodiment of which is described in greater detail below. In one embodiment, the SSD may include an on-chip controller and NAND flash memory.

Electronic system 100 may also be coupled via bus 105 to display device 150, such as a cathode ray tube (CRT) or liquid crystal display (LCD), to display information to a user. Alphanumeric input device 160, including alphanumeric and other keys, may be coupled to bus 105 to communicate information and command selections to processor 110. Another type of user input device is cursor control 170, such as a mouse, a trackball, or cursor direction keys to communicate direction information and command selections to processor 110 and to control cursor movement on display 150.

Electronic system 100 further may include network interface(s) 180 to provide access to a network, such as a local area network. Network interface(s) 180 may include, for example, a wireless network interface having antenna 185, which may represent one or more antenna(e). Network interface(s) 180 may also include, for example, a wired network interface to communicate with remote devices via network cable 187, which may be, for example, an Ethernet cable, a coaxial cable, a fiber optic cable, a serial cable, or a parallel cable.

In one embodiment, network interface(s) 180 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 180 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Figure 2:
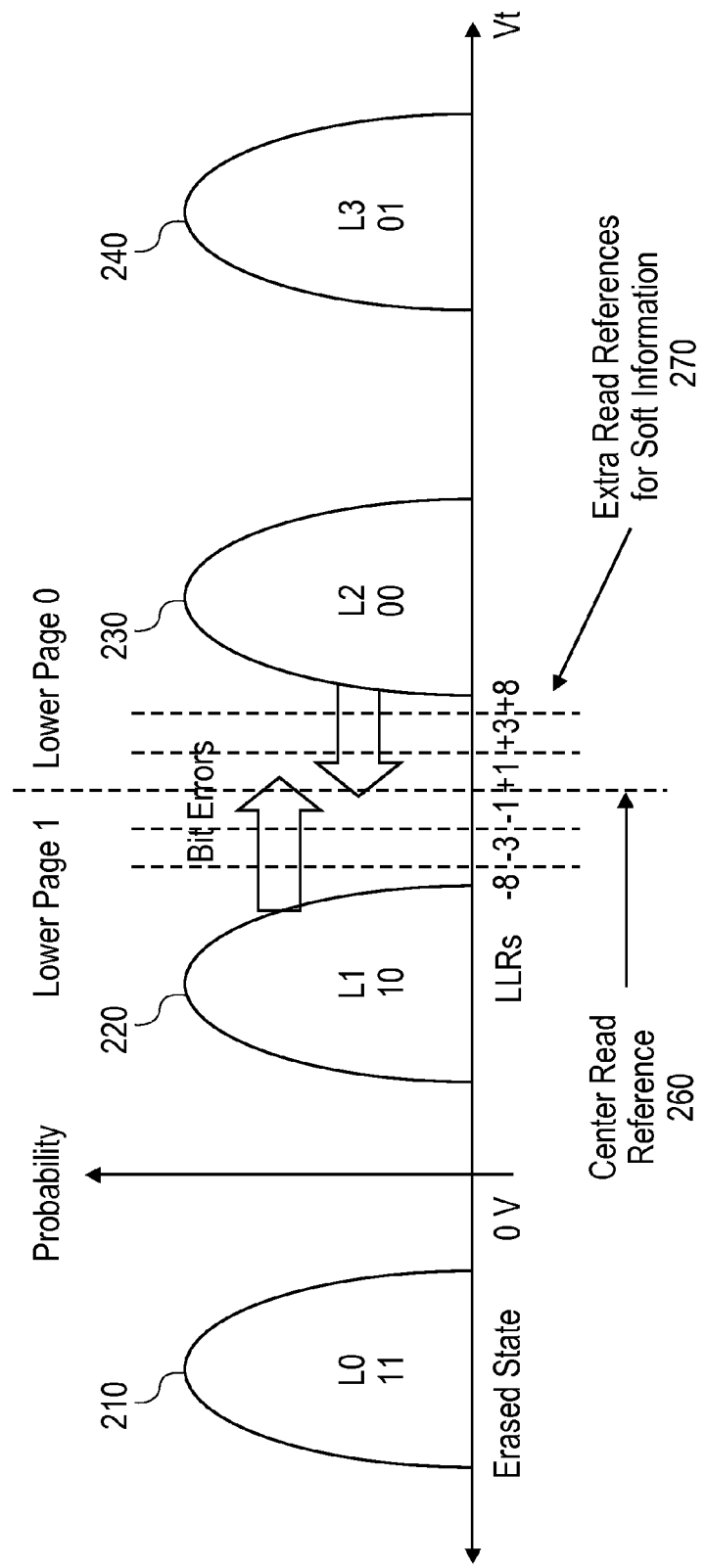
FIG. 2 is a diagram of voltage versus probability that may represent a technique for decoding reads from flash memory having two bits per cell.

FIG. 2 is a diagram of voltage versus probability that may represent a technique for decoding reads from flash memory having two bits per cell. The diagram of FIG. 2 corresponds to a two-bit per cell NAND flash memory, but the concepts represented by FIG. 2 are applicable to other types of non-volatile memory as well.

Curves 210, 220, 230 and 240 represent the mathematical probability that the voltage along the horizontal axis corresponds to various bit combinations. In the example of FIG. 2 a binary value of "11" is referred to as Level 0 (L0), the binary value of "10" is referred to as Level 1 (L1), the binary value of "00" is referred to as Level 2 (L2), and the binary value of "01" is referred to as Level 3 (L3).

Using the probabilities represented in FIG. 2, a voltage read from a memory cell can be decoded to correspond to a two-bit value. However, as discussed above, under certain conditions, read errors may occur that may cause a value written as L2 to be read as L1 or that a value written as L1 to be read as L2. This would be a bit error.

FIG. 2 illustrates various Log-Likelihood Ratio (LLR) values 260 that may be utilized to estimate the probability that the corresponding voltage should be treated as L1 or L2. As the voltage that is read from the cell gets closer to center read reference 260, the lower the confidence that the voltage represents L1 or L2. In the description that follows, a modified LLR may be used to compensate for misplacement, PD and/or SBCL.

In one embodiment, a modified LLR used for decoding memory reads from a NAND memory device may be modified to compensate for the misplacement effect described above. For NAND flash memory with three bits per cell and LDPC encoded data, the LLR values may be computed based on the channel and the number of reads. If the number of reads is n, then n+1 LLR values are computed depending on the level distribution statistics. In the example of FIG. 2, five reads are performed and 6 LLR values are generated.

LLR values are typically symmetric because the misplacement model is not incorporated in theoretical computations. If a misplacement error occurs, a 1 bit is read out as a 0 and the LLR of the 0 due to misplacement can take on a value that erroneously indicates that it has high reliability. The can cause appreciable degradation if the misplacement probability is above some threshold value. In one embodiment, a misplacement probability is incorporated into the LLR computation.

The PD and SBCL error can be described as long-tail effects and the techniques described herein may be utilized to use the misplacement probability incorporated into the LLR computation to improve performance of the LDPC decoder to offset both long tails and misplacement. The theoretical model follows with system level applications.

Long tails effectively cause the probability density functions (PDFs) to deviate from an ideal Gaussian distribution. Consider a two-level example having Level 0 and Level 1. Let the above edge variance of Level 0 is $\sigma_1^2$ and the below edge variance of level 1 is $\sigma_0^2$. The variances are so labeled because Level 0 corresponds to a bit 1 of the upper page and Level 1 corresponds to a bit 0 of the upper page.

Due to PD, the above edge variance of Level 0 will be much higher compared to the below edge variance of Level 1, $\sigma_1^2 > \sigma_0^2$. While reading the upper page, the reference voltage is applied in the valley between Level 0 and Level 1. Because a NAND read results in soft information, the readout voltage value r is mapped to the LLR.

$$LLR(r) = \ln\frac{p(r \mid x = 0)}{p(r \mid x = 1)}$$

In the above equation, if Level 0 has a mean voltage level of −a and Level 1 has a mean voltage of a, then $$LLR(r) = \log\frac{\frac{1}{\sqrt{2\pi\sigma_0^2}}\exp\left(-\frac{(r-a)^2}{2\sigma_0^2}\right)}{\frac{1}{\sqrt{2\pi\sigma_1^2}}\exp\left(-\frac{(r+a)^2}{2\sigma_1^2}\right)}$$

$$LLR(r) = \log\frac{\sigma_1}{\sigma_0} + \frac{(r^2 + a^2)(\sigma_0^2 - \sigma_1^2)}{2\sigma_0^2\sigma_1^2} + \frac{ra(\sigma_0^2 + \sigma_1^2)}{\sigma_0^2\sigma_1^2}$$

The LLR which would be a linear function of the received noisy level if ideal Gaussian distributions with the same variance were realized is modified to a non-linear function of the readout voltage level. In one embodiment, a non-linear mapping of the readout voltage can be provided to generate the LLR values that are input to the LDPC decoder. This LLR modification can be used to combat long tails due to different variances between the below edge variance and above edge variance of two levels.

For multilevel NAND flash memories, the lower page is programmed first. Subsequently, the middle page is programmed and to program the middle page, the lower page information has to be read. While reading the lower page information, errors may occur and a 1 bit can be read out as a 0 bit, and vice versa. If this error occurs, then the final programmed voltage is in error This impairment, referred to as misplacement, can be compensated for during the LDPC decoding. Misplacements can be single sided or double sided. For example, if only two levels are programmed, in single sided misplacements Level 0 is correctly programmed, but Level 1 can be erroneously programmed as a Level 0. Double sided misplacements occur when both levels can be incorrectly read out with the same probability.

For the following analysis the double-sided misplacement probability is α. If α=0 (no misplacements) and the PDFs of the two levels have a Gaussian distribution with variance $\sigma^2$, then the LLR is $$LLR(r) = \frac{2ar}{\sigma^2}$$

However, if α>0

$$LLR(r) = \ln\frac{p(r\mid x=0)}{p(r\mid x=1)}$$

$$LLR(r) = \log\frac{\frac{(1-\alpha)}{\sqrt{2\pi\sigma^2}}\exp(-(r-a)^2/2\sigma^2) + \frac{\alpha}{\sqrt{2\pi\sigma^2}}\exp(-(r+a)^2/2\sigma^2)}{\frac{\alpha}{\sqrt{2\pi\sigma^2}}\exp(-(r-a)^2/2\sigma^2) + \frac{(1-\alpha)}{\sqrt{2\pi\sigma^2}}\exp(-(r+a)^2/2\sigma^2)}$$

If $\alpha_1 = \log(1-\alpha)$ and $\alpha_2 = \log(\alpha)$, then $$LLR(r) = \log\frac{\frac{\exp(-\alpha_1)}{\sqrt{2\pi\sigma^2}}\exp(-(r-a)^2/2\sigma^2) + \frac{\exp(-\alpha_2)}{\sqrt{2\pi\sigma^2}}\exp(-(r+a)^2/2\sigma^2)}{\frac{\exp(-\alpha_2)}{\sqrt{2\pi\sigma^2}}\exp(-(r-a)^2/2\sigma^2) + \frac{\exp(-\alpha_1)}{\sqrt{2\pi\sigma^2}}\exp(-(r+a)^2/2\sigma^2)}$$

$$LLR(r) = \log\frac{\exp(2ar/\sigma^2 - \alpha_1) + \exp(-\alpha_2)}{\exp(2ar/\sigma^2 - \alpha_2) + \exp(-\alpha_1)}$$

$$LLR(r) = \log\frac{\exp\left(\frac{2ar}{\sigma^2} + (\alpha_2 - \alpha_1)\right) + 1}{\exp\left(\frac{2ar}{\sigma^2}\right) + \exp(\alpha_2 - \alpha_1)}$$

$$|LLR(r)| \approx \min\left(\left|\frac{2ar}{\sigma^2}\right|, |\alpha_2 - \alpha_1|\right) = \min\left(\left|\frac{2ar}{\sigma^2}\right|, |(\log(\alpha) - \log(1-\alpha))|\right)$$

Hence, the effect of misplacements is to clip the LLR values. Because the high confidence 0 can be a consequence of a 1 mapping to a 0 due to misplacement, the reliability is clipped and values larger than some threshold (which depends on the misplacement probability) should not be allowed. In single sided misplacement, only the LLR for the bit that is more error prone is clipped because the error-prone bit is not as reliable as the other bit.

Thus, in one embodiment, the magnitude of the LLR for the 0 bit may be reduced to the minimum of: 1) the regular LLR value, or 2) the reduced LLR, which is a function of the misplacement probability.

Using the modified LLR, the voltage read from the cell may be decoded and utilized. Data read from the cell may be utilized for any purpose. For example, the data may be written to a different memory location in the non-volatile memory, the data may be written to a location in a volatile memory, the data may be used by a computational circuit to perform an operation, the data may represent pixel data to be displayed on a display device, or may represent audio information to be use to drive speakers, etc.

Figure 3:
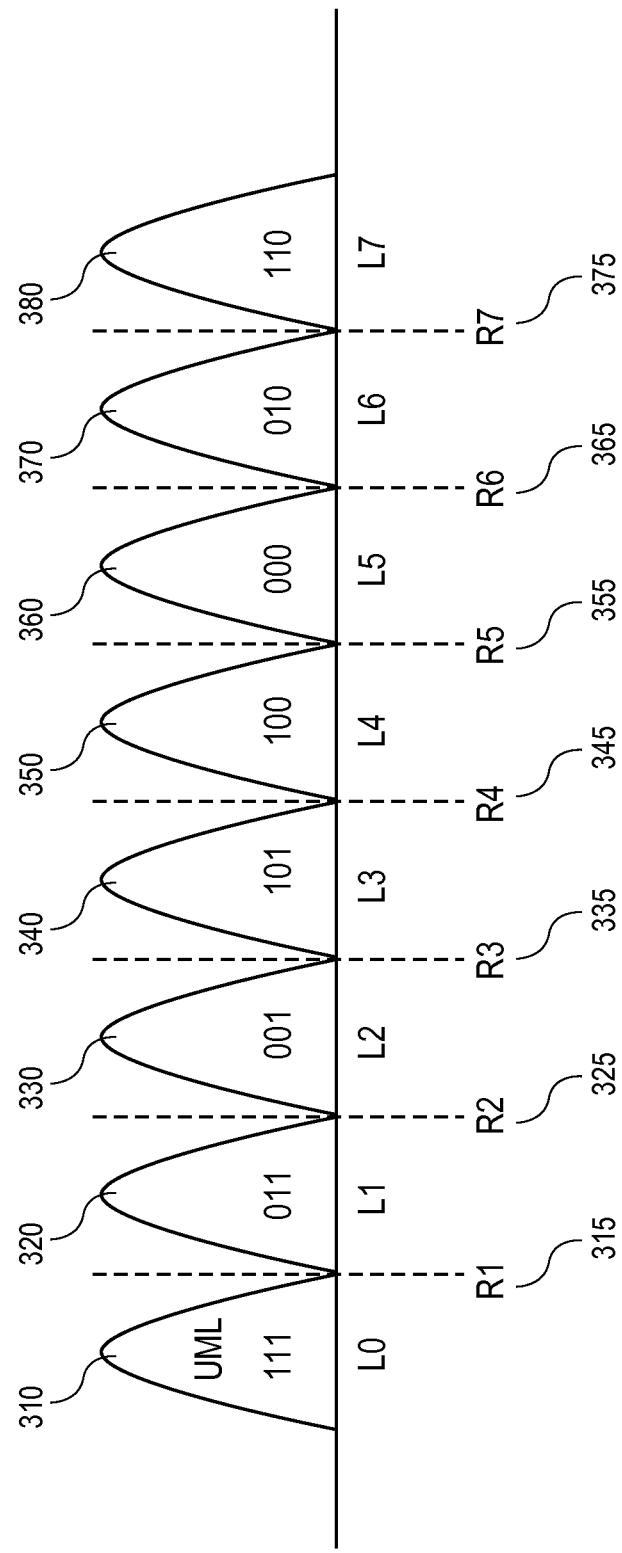
FIG. 3 is a diagram of voltage versus probability that may represent a technique for decoding reads from flash memory having three bits per cell.

FIG. 3 is a diagram of voltage versus probability that may represent a technique for decoding reads from flash memory having three bits per cell. Curves 310, 320, 330, 340, 350, 360, 370 and 380 represent the mathematical probability that the voltage along the horizontal axis corresponds to various bit combinations. In the example of FIG. 3 a binary value of "111" is referred to as Level 0 (L0), the binary value of "011" is referred to as Level 1 (L1), the binary value of "001" is referred to as Level 2 (L2), the binary value of "101" is referred to as Level 3 (L3), the binary value of "100" is referred to a Level 4 (L4), the binary value of "000" is referred to as Level 5 (L5), the binary value of "010" is referred to as Level 6 (L6), and the binary value "110" is referred to as Level 7 (L7). The first bit in the 3-bit representation above is the upper page bit, the middle bit is the middle page bit and the least significant bit is the lower page bit.

Using the probabilities represented in FIG. 3, a voltage read from a memory cell can be decoded to correspond to a three-bit value. However, as discussed above, under certain conditions, read errors may occur that may cause a value written as L2 to be read as L1 or that a value written as L1 to be read as L2. This would be a bit error. Read reference values 315, 325, 335, 345, 355, 365 and 375 indicate boundaries between levels. The LLR techniques discussed above for two-bit cells are equally applicable to three-bit cells as illustrated in FIG. 3.

Figure 4:
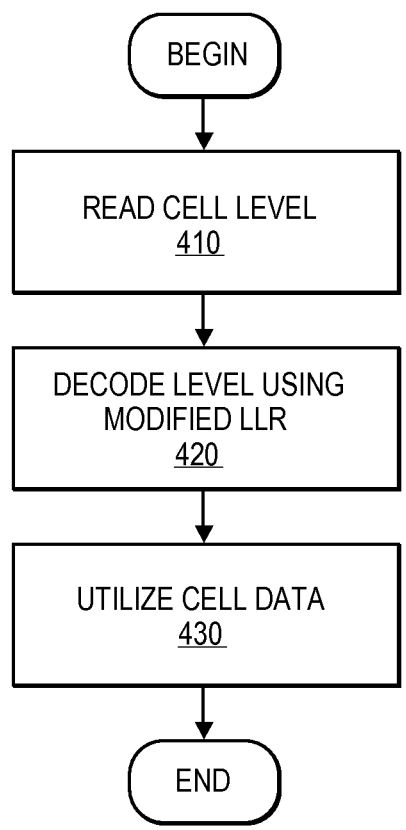
FIG. 4 is a flow diagram of one embodiment of a technique for decoding a memory cell using a modified LLR.

FIG. 4 is a flow diagram of one embodiment of a technique for decoding a memory cell using a modified LLR. The technique of FIG. 4 described one embodiment of a technique for reading a cell of a non-volatile memory (e.g., NAND flash). The data may be written to the cell in any manner known in the art.

The cell level is read, 410. Reading of the cell level may be accomplished in any manner known in the art. The cell may be, for example, a two-bit NAND flash cell, a three-bit NAND flash cell, a four-bit NAND flash cell, or other type of memory cell.

The level is decoded, 420. Decoding is accomplished utilizing the modified LLR and/or standard LLR decoding techniques. As discussed above, the modified LLR may provide a mechanism to compensate for misplacement and provide an error correcting effect.

Once the cell level is decoded, the bits may be utilized, 430. Bits representing the cell level may be transmitted, stored, or otherwise utilized to provide functionality to a system communicatively coupled with the memory having the cell.

Non-volatile memories may also suffer from PD and or SBCL. For a three-bit per cell memory, PD causes a L0 written to the cell to gain charge if the neighboring cells are programmed to a binary "111" or Level 7 (L7) to be read as a L1 (or maybe even some other higher level). SBCL causes charge to leak from a L7 to be read as a Level 6 (L6) or lower.

For NAND flash memories with LDPC encoded data, when data is read out of the upper page, a bit 0 read may not be reliable due to PD. If the level information is available, the LDPC decoder can use this information to modify the LLRs. For example, if three neighboring levels are 7-1-7, then the level 1 between the two level 7 values may be a level 0 that has been transformed to a level 1 due to PD. The LDPC decoder can use this information to pre-process LLRs before decoding.

For NAND flash memories with three bits per cell, and LDPC encoded data, the LLR values are computed based on the cannel and the number of reads. If the number of reads is n, then n+1 LLR values are possible. If n is odd, half of the LLR values are negative and the other half are positive.

If the level information is available for all neighboring cells, this information can be used to flag suspect bit 0 reads that have a higher probability of being a bit 1 modified to a bit 0 as a consequence of PD. A program disturb means that a 7-0-7 level information is modified to a 7-1-7 or even a 7-2-7 due to the middle cell picking up charge from neighboring L7 cells. Thus, a bit 1 that is the upper page bit for the L0 changes to a bit 0 during a read.

If the level information is available, all the 7-1-7 and/or 7-2-7 levels can be identified and the 0 bits for the middle cells can be flagged as suspect. The magnitude of the LLRs for these can be modified (e.g., clipped to the lowest allowable non-zero magnitude or clipped according to a percentage of PD) to better represent the PD phenomenon. This will prevent the 0 due to misplacement to appear as highly reliable bit and otherwise causes the LDPC decoder to misread the level.

There are various reasons why the magnitude of the LLR of the 0 bits for the 7-1-7 and/or 7-2-7 patterns are only clipped to the lowest non-zero value. If the LLR is set to 0, which means the bit is erased, then there is a greater loss of information, which degrades performance. If the magnitude is clipped to a non-zero value, then the unnecessary cautioning on an actual 0 only causes an LLR reduction and not an erasure. Thus, information loss is minimized. Various clipping values were tried and depending on the percentage of level 0's migrating to level 1's due to program disturb, the clip value was changed. If the % is very low, then only clipping the LLR of the PD cell by one magnitude lower suffices. If the PD % is higher, then clipping to a lower magnitude is required.

Constrained coding is another technique that may be used to avoid the occurrence of problematic (e.g., 7-0-7) patterns. However, constrained coding comes at the cost of adding redundancy and extra encoding/decoding complexity. In one embodiment, a constrained coder substantially reduces the 7-0-7 patterns and the output of the constrained coder is free from the 7-0-7 pattern. Because the L0s are not surrounded by L7s, a PD error cannot occur. At the decoder, the level information is first passed through a constrained decoder before being decoded by the LDPC decoder.

Constrained codes may be designed in various ways to avoid various patterns. Described below, are two types of constrained codes that may be used to avoid the 7-0-7 pattern. Type 1 constrained codes modify the level information such that the bits change for all pages. For example, in a three bit per cell memory, the lower page (LP), the middle page (MP) and the upper page (UP) may be modified. Type 2 constrained codes do not modify level information on all pages. For example, in a three bit per cell memory, only the UP may be modified. The advantage of Type 2 codes is that the level information is not necessary to decode the LP and MP bits, only the UP.

Figure 5:
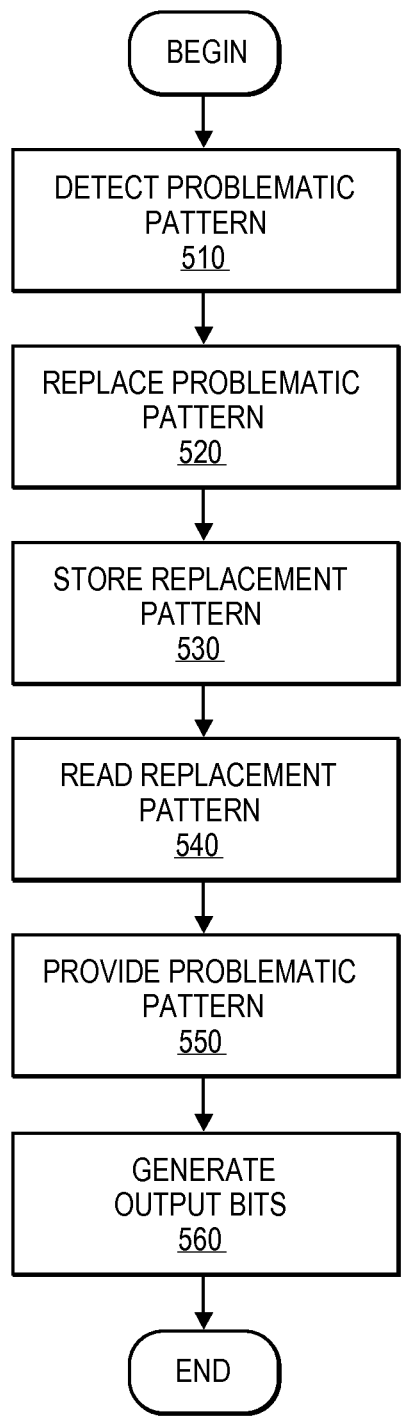
FIG. 5 is a flow diagram of one embodiment of a technique for modifying level patterns to compensate for program disturb errors.

FIG. 5 is a flow diagram of one embodiment of a technique for modifying level patterns to compensate for program disturb errors. The flow diagram of FIG. 5 may be utilized with either Type 1 or Type 2 constrained codes. A problematic pattern is detected, 510. The problematic pattern may be any of the patterns replaced as described herein, for example, 7-0-7. The problematic pattern is replaced by a replacement pattern, 520. The replacement pattern may be any pattern that does not cause a PD error.

The replacement pattern is stored in the non-volatile memory, 530. The non-volatile memory may be, for example, a NAND flash memory. The replacement pattern may be stored until the corresponding memory location is accessed again. The replacement pattern is read, 540. When the replacement pattern is detected, it is replaced by the problematic pattern, 550. Output bits are generated that correspond to the problematic pattern, 560.

Figure 6:
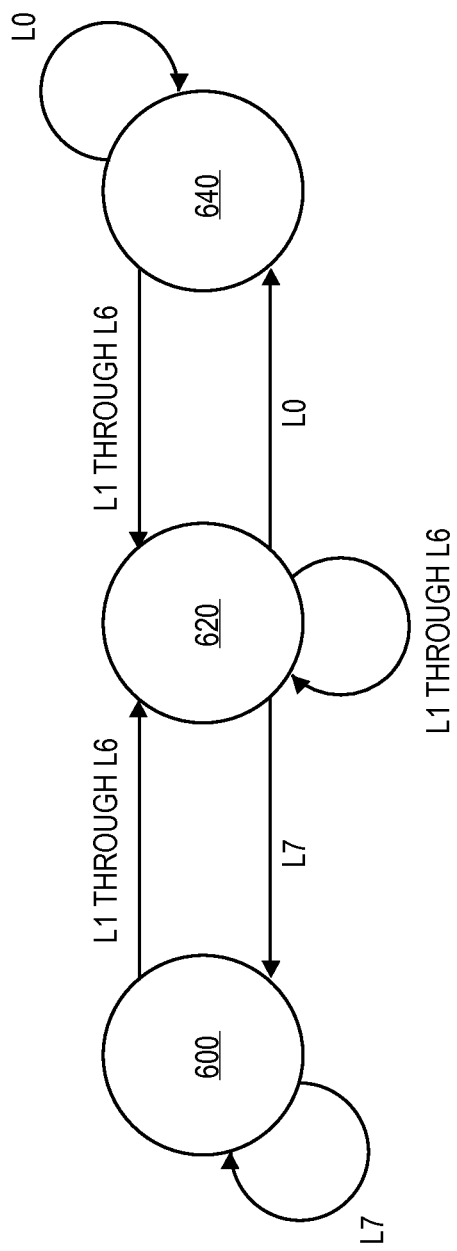
FIG. 6 is an example state transition diagram for a system that does not permit L7-L0 and L0-L7 transitions.

To construct a Type 1 constrained code, a Shannon limit for the constrained system that does not have the 0-7 and the 7-0 levels is obtained. FIG. 6 is an example state transition diagram for a system that does not permit L7-L0 and L0-L7 transitions.

In the example of FIG. 6, States 600 and 640 correspond to a L7 or a L0 being the past output. Because the following output level cannot be a L0 or a L7, the transitions out of state 600 and state 540 do not allow a L0 or a L7. The state matrix for the system of FIG. 6 is:

$$A_G = \begin{bmatrix} 1 & 6 & 0 \\ 1 & 6 & 1 \\ 0 & 6 & 1 \end{bmatrix}$$

and the capacity in terms of levels per channel use, as obtained from the log of the largest eigenvalue, is 0.986.

A simple Type 1 constrained code that may be used is one that replaces:

$$L7-(nL3)-L0 \quad \text{(Pattern 1)}$$

with $$L7-((n+1)L3)-L0 \quad \text{(Pattern 2)}$$

where n is an integer greater than or equal to 0. The decoder will replace Pattern 2 with Pattern 1. This will eliminate the L7-L0 patterns at the output of the constrained encoder. If Pattern 1 is replaced by Pattern 2 by the constrained encoder, the L0-L7 pattern will be eliminate at the output of the constrained encoder.

The example of that follows is for a Type 2 constrained code design, but provides the advantage that not all bits are modified. In one embodiment, the freedom allowed is that the encoder can map a L0 to a L1 and a L7 to a L6. Thus, a L7-L0 transition can only be replaced by a L6-L0 or a L7-L1 or a L6-L1 transition. Similarly, the L0-L7 transition can be replaced by a L0-L6, L1-L7 or a L1-L6 transition. In one embodiment, the L7-L0 transition is replaced by a L6-L1 transition and the L0-L7 transition is replaced by a L0-L6 transition.

In order to obtain an invertible mapping, the encoder my replace any L7-L0 transition with the L6-L1 transition and any L0-L7 transition with the L0-L6 transition in the level stream and append a 1 bit to the end of the bit stream. The appended bit stream is initialized to the null stream.

In one embodiment, the encoder may append a 0 bit to the end of the bit stream if the L6-L1 or the L0-L6 pattern exists in the level stream. The level stream is read out from left to right. The decoder reads the level stream an if a L6-L1 or a L0-L6 level is found, it either keeps the level stream untouched if the current appended bit in the appended bit stream is a 0 or replaces these levels with the L7-L0 or the L0-L7 if the appended bit is a 1.

The amount of redundancy added depends on the size of the appended bit stream. Because the number of appended bits depends on the level input to the constrained encoder, this constrained code is a variable length constrained code.

The appended bit stream can be efficiently encoded. Level information can be generated from the appended bit stream and these levels can be programmed after the LDPC codeword is programmed. For the LP an MP, the bits for the appended level programmed information will be unused. Only while reading the UP, these levels will be read out and used by the constrained decoder.

During reads valid L6-L1 or L0-L6 transitions can map to different levels and consecutive levels that are not L6-L1 or L0-L6 may map to one of these levels. The first effect may lead to skipping of the levels that have an appended bit assigned to their occurrence and the second effect may lead to an appended bit expanded at the wrong position. Both of these may result in error propagation. The first effect may lead to a deletion in the level information space and the second effect may lead to insertion in the level information space.

In order to mitigate this effect, a more robust scheme may be utilized. Instead of appending a 0 or a 1 when the L6-L1 (or the L7-L0) tuple occurs (or a L0-L7 or L0-L6 tuple occurs), another 0 or 1 may be appended to indicate if the programmed level was a L6-L1 or a L0-L6 tuple. During reads the insertions and deletions can be estimated because the readout level is known. A trellis may be constructed to do a maximum-likelihood decoding on the channel to introduce insertions, deletions and errors to estimate the insertion and deletion positions. This can mitigate error propagation.

Figure 7:
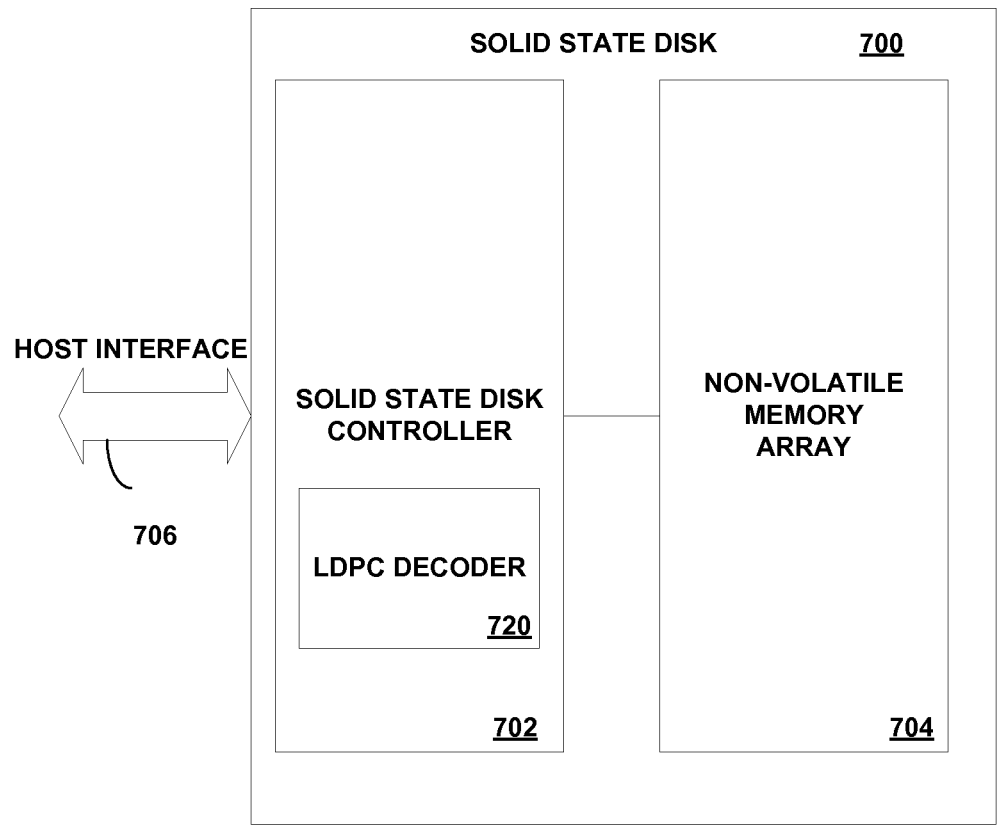
FIG. 7 is a block diagram of one embodiment of a solid state disk.

FIG. 7 is a block diagram of an embodiment of a solid state disk 700. Solid state disks (also "solid state drives") use semiconductor memories, also referred to as solid state memories, as a storage medium. Semiconductor memories are comparatively more rugged than hard drives and offer the advantage of being much less sensitive to vibration, dust, humidity, and sudden changes in velocity. Semiconductor memories also tend to require less power than a typical hard drive with similar storage capacity.

Solid state disk 700 includes a solid state disk controller 702 to control nonvolatile memory array 704. Solid state disk 700 communicates with a host controller via a host interface 706. The solid state disk controller 702 controls reading, writing and erasing of the nonvolatile memory array 704 and may include LDPC decoder 720. In one embodiment, solid state disk controller implements the techniques described herein and non-volatile memory array 704 may be a NAND flash memory.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   reading a level of a cell in a multi-bit non-volatile memory;
   using a minimum of Log-Likelihood Ratio (LLR) and a modified LLR to decode the level, wherein the modified LLR is a function of a misplacement probability; and
   writing to a volatile memory, a value corresponding the decoded level.

2. The method of claim 1 wherein the non-volatile memory comprises a NAND flash memory.

3. The method of claim 2 further comprising performing Low-Density Parity Check (LDPC) encoded on data to be stored by the NAND flash memory.

4. The method of claim 1 using the minimum of Log-Likelihood Ratio (LLR) and a modified LLR to decode the level comprises determining the minimum of: 1) a regular LLR value, or 2) a reduced LLR, which is a function of the misplacement probability.

5. A system comprising:
   a non-volatile memory array;
   a memory decoder coupled with the non-volatile memory array, the memory decoder to read a level of a cell in a multi-bit non-volatile memory, to use a minimum of Log-Likelihood Ratio (LLR) and a modified LLR to decode the level, wherein the modified LLR is a function of a misplacement probability, and to transmit a signal comprising bits of data corresponding to the decoded levels.

6. The system of claim 5 wherein the non-volatile memory comprises a NAND flash memory.

7. The system of claim 6 further comprising performing Low-Density Parity Check (LDPC) encoded on data to be stored in the NAND flash memory.

8. The system of claim 5 using the minimum of Log-Likelihood Ratio (LLR) and a modified LLR to decode the level comprises determining the minimum of: 1) a regular LLR value, or 2) a reduced LLR, which is a function of the misplacement probability.

9. The system of claim 5 further comprising a dynamic random access memory (DRAM) coupled with the memory decoder.

10. A non-transitory computer-readable medium having stored thereon instructions that, when executed, cause one or more processors to:
    read a level of a cell in a multi-bit non-volatile memory;
    use a minimum of Log-Likelihood Ratio (LLR) and a modified LLR to decode the level, wherein the modified LLR is a function of a misplacement probability; and
    write to a volatile memory, a value corresponding the decoded level.

11. The non-transitory computer-readable medium of claim 10 wherein the non-volatile memory comprises a NAND flash memory.

12. The non-transitory computer-readable medium of claim 11 further comprising performing Low-Density Parity Check (LDPC) encoded on data to be stored by the NAND flash memory.

13. The non-transitory computer-readable medium of claim 10 using the minimum of Log-Likelihood Ratio (LLR) and a modified LLR to decode the level comprises determining the minimum of: 1) a regular LLR value, or 2) a reduced LLR, which is a function of the misplacement probability.

14. A system comprising:
    an omnidirectional antenna;
    one or more processors coupled with the omnidirectional antenna;
    a multi-bit non-volatile memory;
    a memory controller coupled with the one or more processors and the non-volatile memory, the memory controller to read a level of a cell in the multi-bit non-volatile memory, to use a minimum of Log-Likelihood Ratio (LLR) and a modified LLR to decode the level, wherein the modified LLR is a function of a misplacement probability, and to write to a volatile memory, a value corresponding the decoded level.

15. The system of claim 14 wherein the non-volatile memory comprises a NAND flash memory.

16. The system of claim 15 further comprising performing Low-Density Parity Check (LDPC) encoded on data to be stored in the NAND flash memory.

17. The system of claim 14 using the minimum of Log-Likelihood Ratio (LLR) and a modified LLR to decode the level comprises determining the minimum of: 1) a regular LLR value, or 2) a reduced LLR, which is a function of the misplacement probability.

18. The system of claim 14 further comprising a dynamic random access memory (DRAM) coupled with the memory controller.

* * * * *